United States Patent
Preuhs et al.

(10) Patent No.: US 12,315,045 B2
(45) Date of Patent: May 27, 2025

(54) TASK-SPECIFIC TRAINING OF RECONSTRUCTION NEURAL NETWORK ALGORITHM FOR MAGNETIC RESONANCE IMAGING RECONSTRUCTION

(71) Applicant: Siemens Healthcare GmbH, Erlangen (DE)

(72) Inventors: Alexander Preuhs, Erlangen (DE); Mario Orsini, Grand Rapids, MI (US)

(73) Assignee: SIEMENS HEALTHINEERS AG, Forchheim (DE)

(*) Notice: Subject to any disclaimer, the term of this patent is extended or adjusted under 35 U.S.C. 154(b) by 443 days.

(21) Appl. No.: 17/824,268

(22) Filed: May 25, 2022

(65) Prior Publication Data
US 2022/0392122 A1    Dec. 8, 2022

(30) Foreign Application Priority Data
May 28, 2021   (EP) ..................... 21176482

(51) Int. Cl.
| | | |
|---|---|---|
| *G06T 11/00* | (2006.01) | |
| *G06V 10/82* | (2022.01) | |
| *G06V 20/50* | (2022.01) | |

(52) U.S. Cl.
CPC ............ *G06T 11/005* (2013.01); *G06V 10/82* (2022.01); *G06V 20/50* (2022.01); *G06T 2210/41* (2013.01)

(58) Field of Classification Search
None
See application file for complete search history.

(56) References Cited

U.S. PATENT DOCUMENTS

2021/0272240 A1*  9/2021  Litwiller ............. A61B 6/5258
2021/0295474 A1*  9/2021  Wang ..................... G16H 30/40

OTHER PUBLICATIONS

Zhang et al., "Review on Deep Learning in Medical Image Reconstruction," arXiv: 1906.10643v1 [eess.IV] Jun. 23, 2019 (Year: 2019).*
Zbontar, Jure, et al. "fastMRI: An open dataset and benchmarks for accelerated MRI." arXiv preprint arXiv:1811.08839 (2018).; 2018.
(Continued)

*Primary Examiner* — Soo Shin
(74) *Attorney, Agent, or Firm* — Harness, Dickey & Pierce, P.L.C.

(57) ABSTRACT

In a computer-implemented method of training a reconstruction neural network algorithm used to reconstruct a Magnetic Resonance Imaging (MRI) image, a prediction of training MRI image is determined based on training MRI raw data and using the reconstruction neural network algorithm. A prediction of a presence or absence of the object in the training MRI image is determined based on the prediction of the training MRI image and using an object-detection algorithm. A loss value is determined based on a first difference between the ground truth of the training MRI image and the prediction of the training MRI image, and further based on a second difference between the ground truth of the presence or absence of the object and the prediction of the presence or absence of the object. Weights of the reconstruction neural network algorithm are adjusted based on the loss value and using a training process.

18 Claims, 2 Drawing Sheets

(56) References Cited

OTHER PUBLICATIONS

Dufan, Wu et al; "End-to-end abnormality detection in medical imaging." arXiv preprint arXiv:1711.02074 (2017).; Cornell university library; Nov. 6, 2017 (Nov. 6, 2017), pp. 1-15, XP080834821; 2017.

Weiss, Tomer et al: "Learning Fast Magnetic Resonance Imaging"; May 22, 2019 (May 22, 2019), XP055685007; Retrieved from the Internet: URL:https://arxiv.org/pdf/1905.09324v1.pdf.

Knoll, Florian et al.: "Deep Learning Methods for Parallel Magnetic Resonance Image Reconstruction", in: arXiv:1904.01112v1, pp. 1-14, 2019; 2019.

Van, Yang et al: "ADMM-Net: A Deep Learning Approach for Compressive Sensing MRI II"; arxiv.org, Cornell University Library, 201 Olin Library Cornell University Ithaca, NY 14853; May 19, 2017 (May 19, 2017), XP080948879.

Michael Lustig et al., Compressed Sensing MRI, IEEE Signal Processing Magazine (72), Mar. 2008, pp. 72-82; 2008.

Zhu, Bo, et al. "Image reconstruction by domain-transform manifold learning." Nature 555.7697 (2018).; 2018.

Lustig, Michael; et al: "Sparse MRI: The application of compressed sensing for rapid MR imaging", Magnetic resonance in medicine vol. 58, No. 6, 2007, pp. 1182-1195.

Ronneberger, O., Fischer, P., & Brox, T.: "U-net: Convolutional networks for biomedical image segmentation", Computer Science Department and BIOSS Centre for Biological Signalling Studies, University of Freiburg, pp. 234-241, 2015.

Xuan, Kai et al: "Learning MRI-Space Subsampling Pattern Using Progressive Weight Pruning"; Sep. 29, 2020 (Sep. 29, 2020); Advances in Cryptology—CRYPTO 2013; [Lecture Notes in Computer Science; Lect.Notes Computer], Springer Berlin Heidelberg; pp. 178-187, XP047563817.

Haimiao, Zhang et al: "A Review on Deep Learning in Medical Image Reconstruction"; arxiv.org, Cornell University Library, 201 Olin Library Cornell University Ithaca, NY 14853; Jun. 23, 2019 (Jun. 23, 2019); XP081379530.

Lin et al., "Focal Loss for Dense Object Detection," 2017, Proceedings of the IEEE International Conference on Computer Vision (ICCV), pp. 2980-2988.; 2017.

Xuan K. et al.: "Learning MRI k-Space Subsampling Pattern Using Progressive Weight Pruning ", MICCAI 2020.

Hammernik K. et al.:"Learning a Variational Network for Reconstruction of Accelerated MRI Data", arXiv:1704.00447v1 [cs.CV] Apr. 3, 2017.

* cited by examiner

TASK-SPECIFIC TRAINING OF RECONSTRUCTION NEURAL NETWORK ALGORITHM FOR MAGNETIC RESONANCE IMAGING RECONSTRUCTION

CROSS-REFERENCE TO RELATED APPLICATION(S)

The present application claims priority under 35 U.S.C. § 119 to European Patent Application No. EP 21176482.4, filed May 28, 2021, the entire contents of which are incorporated herein by reference.

FIELD

Various examples of the disclosure broadly relate to magnetic resonance imaging reconstruction of undersampled k-space raw data. Various examples of the disclosure more specifically relate to training of a respective reconstruction neural network algorithm.

BACKGROUND

Magnetic resonance imaging (MRI) allows reconstruction of internal anatomic structures of a patient. MRI images depict soft tissue with significant contrast. For that purpose, the atomic nuclei are excited using radio-frequency (RF) pulses. The excitation can be encoded to a specific slice using a gradient DC magnetic field. The RF response of the relaxing atomic nuclei is measured using RF antennas. Again, DC gradients can be used to obtain spatial resolution. The raw MRI data is available in K-space.

Typically, the acquisition of MRI raw data requires significant time; typical acquisition times are in the order of minutes or tens of minutes. The K-space needs to be sampled with sufficient K-space samples to allow for reconstruction without ambiguities given a certain field of view.

To speed up the measurement, the k-space can be undersampled using a respective k-space trajectory. MRI reconstruction can be used to reconstruct the MRI image without aliasing artifacts.

Various techniques for implementing MRI reconstruction are known. One prior art technique is referred to as compressed sensing. See, e.g., Lustig, Michael, David Donoho, and John M. Pauly. "Sparse MRI: The application of compressed sensing for rapid MR imaging." Magnetic Resonance in Medicine: An Official Journal of the International Society for Magnetic Resonance in Medicine 58.6 (2007): 1182-1195; also see Lustig, Michael, et al. "Compressed sensing MRI." IEEE signal processing magazine 25.2 (2008): 72-82.; also Zbontar, Jure, et al. "fastMRI: An open dataset and benchmarks for accelerated MRI." arXiv preprint arXiv:1811.08839 (2018).

Often, such prior art techniques rely on representation of MRI images in a wavelet basis. As described in id., page 13, section "Image Reconstruction", an optimization problem—typically defined in an $\ell$-norm—can be defined. Data consistency can be enforced by a data-consistency operation ensuring that the reconstructed image is described well by the underlying k-space data sparsely sampled. The data-consistency operation is also sometimes referred to as data-fidelity operation or forward-sampling operator. In addition to the data-consistency operation, oftentimes, a regularization operation is considered. The regularization operation is conventionally based on a non-linear $\ell$-norm. A classic formulation of the regularization operation is based on sparsity of the MRI image in a transform domain such as a wavelet domain in combination with pseudo-random sampling that can introduce aliasing artifacts that are incoherent in the respective transform domain. Another example would be a Fourier domain, in particular for acquisitions of a dynamically moving target. Another example would be total variation (TV) used in connection with non-Cartesian k-space trajectories such as radial and spiral trajectories.

Based on the data-consistency operation and the regularization operation, an iterative optimization can be implemented. The iterative optimization can include multiple iterations, each iteration including the calculation of the data-consistency operation and the regularization operation in an alternating fashion.

Recently, the regularization operation has been implemented via neural network algorithms (NNs). Here, different iterations of the optimization are implemented by different layers of the NN. See Hammernik, Kerstin, et al. "Learning a variational network for reconstruction of accelerated MRI data." Magnetic resonance in medicine 79.6 (2018): 3055-3071, as well as Knoll, Florian, et al. "Deep learning methods for parallel magnetic resonance image reconstruction." arXiv preprint arXiv:1904.01112 (2019). Such techniques are based on the finding that wavelet compositions can be expressed as a subset of trainable convolutions of a deep NN such as a convolutional NN and that soft-thresholding can be used as an activation function in the deep NN.

Another example of MRI reconstruction using NNs is described in Xuan, Kai, et al. "Learning MRI k-Space Subsampling Pattern Using Progressive Weight Pruning." International Conference on Medical Image Computing and Computer-Assisted Intervention. Springer, Cham, 2020.

The accuracy of MRI image reconstruction based on a NN depends on accurate training of the NN.

SUMMARY

The inventors have identified a need for advanced techniques of training NNs used for MRI image reconstruction. This, and other needs, may be met by one or more embodiments discussed herein.

Hereinafter, techniques of optimizing the data processing for MRI reconstruction are disclosed. This is achieved through task-specific training of a reconstruction NN. More accurate MRI images can be reconstructions. The acquisition time for acquiring the raw MRI data can be reduced.

A computer-implemented method of training a reconstruction neural network algorithm is provided. The reconstruction neural network algorithm is used to reconstruct am MRI image based on MRI raw data. The computer-implemented method includes obtaining training MRI raw data that is acquired using a K-space trajectory. The K-space trajectory is undersampling the K-space. The computer-implemented method further includes obtaining a ground truth of a training MRI image that is associated with the MRI raw data. Additionally, the computer-implemented method includes obtaining a ground truth of an object presence or absence of an object in the training MRI image. The computer-implemented method includes, based on the training MRI raw data and using the reconstruction neural network algorithm, determining a prediction of the training MRI image. The computer-implemented method further includes determining a prediction of a presence or absence of the object in the training MRI image based on the prediction of the training MRI image and using an object-detection algorithm. The computer-implemented method also includes determining a loss value based on a first difference between the ground truth of the training MRI image and the prediction of the training MRI image, as well as further based on a second difference between the ground truth of the presence or absence of the object and the prediction of the presence or absence of the object. Additionally, the computer-implemented method includes adjusting weights of the reconstruction neural network based on the loss value and using a training process.

A computer-implemented method is provided. The computer-implemented method includes obtaining MRI raw data that is acquired using a K-space trajectory that is undersampling the K-space. The computer-implemented method also includes determining a prediction of an MRI image using a reconstruction neural network algorithm. The computer-implemented method further includes determining a prediction of a presence or absence of an object in the MRI image using an object-detection algorithm. The reconstruction neural network algorithm has been trained using the computer-implemented method of training described above.

A computer program or a computer-program or a computer-readable storage medium including program code is provided. The program code can be loaded and executed by at least one processor. Upon loading and executing the program code, the at least one processor performs a computer-implemented method of training a reconstruction neural network algorithm. The reconstruction neural network algorithm is used to reconstruct am MRI image based on MRI raw data. The computer-implemented method includes obtaining training MRI raw data that is acquired using a K-space trajectory. The K-space trajectory is undersampling the K-space. The computer-implemented method further includes obtaining a ground truth of a training MRI image that is associated with the MRI raw data. Additionally, the computer-implemented method includes obtaining a ground truth of an object presence or absence of an object in the training MRI image. The computer-implemented method includes, based on the training MRI raw data and using the reconstruction neural network algorithm, determining a prediction of the training MRI image. The computer-implemented method further includes determining a prediction of a presence or absence of the object in the training MRI image based on the prediction of the training MRI image and using an object-detection algorithm. The computer-implemented method also includes determining a loss value based on a first difference between the ground truth of the training MRI image and the prediction of the training MRI image, as well as further based on a second difference between the ground truth of the presence or absence of the object and the prediction of the presence or absence of the object. Additionally, the computer-implemented method includes adjusting weights of the reconstruction neural network based on the loss value and using a training process.

A device for training a reconstruction neural network algorithm is provided. The reconstruction neural network algorithm is used to reconstruct an MRI image based on MRI raw data. The device includes a processor that is configured to obtain training MRI raw data. The training MRI raw data is acquired using a K-space trajectory that is undersampling the K-space. The processor is further configured to obtain a ground truth of a training MRI image that is associated with the MRI raw data. The processor is further configured to obtain a ground truth of an object presence or absence of an object in the training MRI image. The processor is further configured to determine a prediction of the training MRI image based on the training MRI raw data and using the reconstruction neural network algorithm. The processor is further configured to determine a prediction of a presence or absence of the object in the training MRI image based on the prediction of the training MRI image and using an object-detection algorithm. The processor is further configured to determine a loss value based on a first difference between the ground truth of the training MRI image and the prediction of the training MRI image, as well as further based on a second difference between the ground truth of the presence or absence of the object in the prediction of the presence or absence of the object. The processor is further configured to adjust weights of the reconstruction neural network algorithm based on the loss value and using a training process.

A further device is provided. The device includes a processor that is configured to obtain MRI raw data acquired using a k-space trajectory that is undersampling the k-space. The processor is further configured to determine a prediction of an MRI image using a reconstruction neural network algorithm, and to determine a prediction of a presence or absence of an object in the MIR image using an object-detection algorithm. Herein, the reconstruction neural network algorithm has been trained using the provided computer-implemented method of training a reconstruction neural network algorithm.

It is to be understood that the features mentioned above and those yet to be explained below may be used not only in the respective combinations indicated, but also in other combinations or in isolation without departing from the scope of the present invention.

BRIEF DESCRIPTION OF THE DRAWINGS

Embodiments of the present invention will be discussed in more detail with regard to the drawings in which.

DETAILED DESCRIPTION

Figure 1:
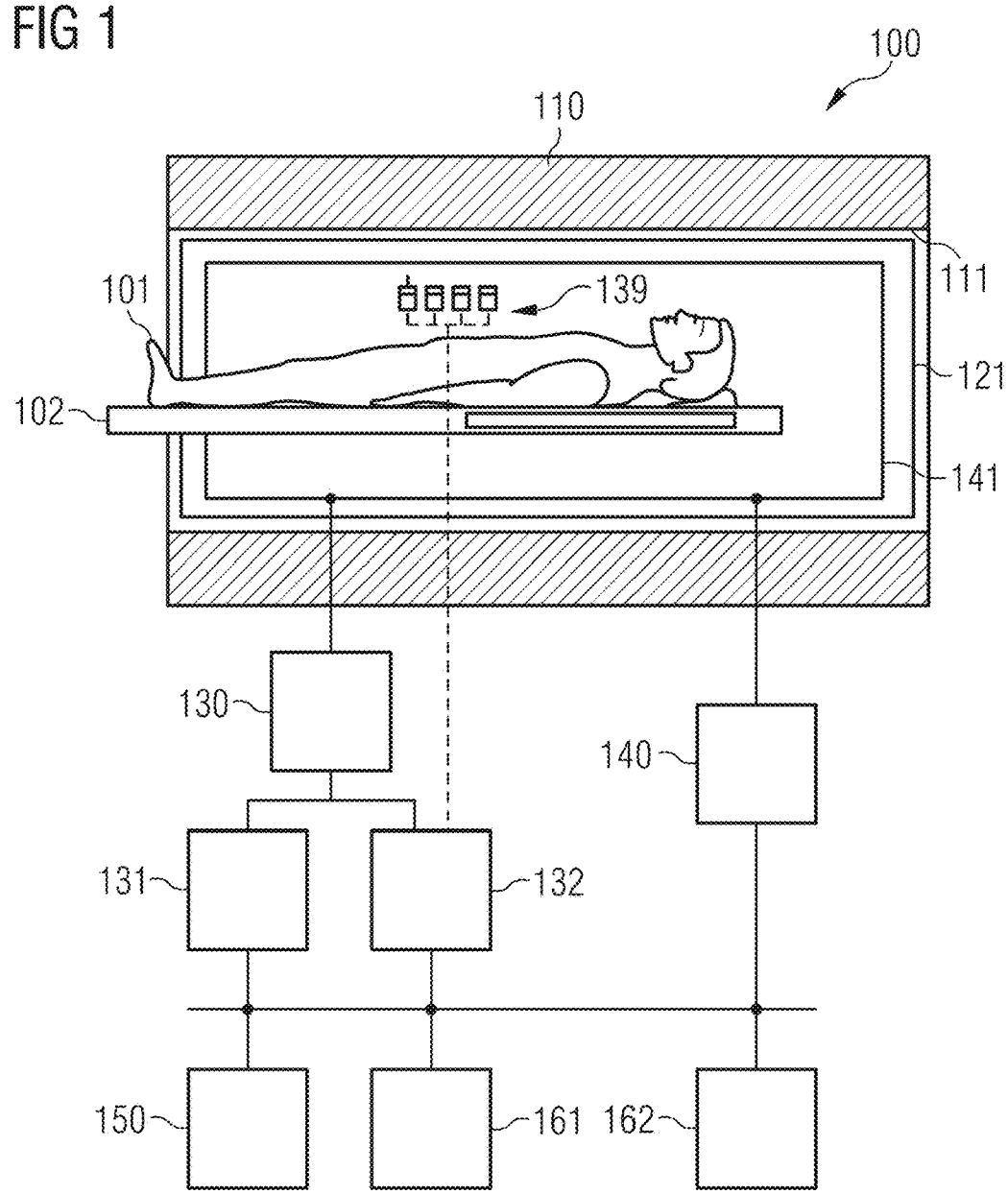
FIG. 1 schematically illustrates an MRI device according to various examples.

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

In the following, embodiments of the present invention will be described in detail with reference to the accompanying drawings. It is to be understood that the following description of embodiments is not to be taken in a limiting sense. The scope of the present invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various techniques described herein generally relate to MRI imaging. MRI raw data is acquired in k-space by sampling k-space. Parallel imaging can be applied. Here, MRI data is acquired using an array of receiver coils having a predefined spatial sensitivity. The MRI raw data is sparsely sampled in k-space, i.e., MRI data is acquired below the Nyquist threshold for a given field of view. This is sometimes referred to as undersampling k-space. According to various examples, the MRI measurement datasets may be obtained using an undersampling trajectory. When acquiring MRI measurement datasets using an undersampling trajectory for certain k-space locations, samples are not obtained and the missing information is reconstructed later on. A so-called acceleration factor R is indicative of the fraction of those k-space locations along the undersampling trajectory for which no raw data samples are acquired. Larger (smaller) acceleration factors may result in a shorter (longer) scan times.

Then, MRI reconstruction is employed to reconstruct an MRI image (reconstructed MRI image) without or having reduced aliasing artifacts. The MRI reconstruction often relies on predetermined or calibrated coil sensitivity maps (CSMs) of multiple receiver coils of the RF receiver of the MRI device are used.

Various techniques disclosed herein rely on MRI reconstruction using NNs. Oftentimes, a trained NN can outperform conventional reconstructions (including iterative approaches such as Compressed Sensing) when applied to a known/trained acquisition. This also goes by the name of deep learning (DL) reconstruction.

As a general rule, the NN employed in the various examples can be a convolution NN. Here, each convolutional layer has a certain kernel which is convoluted against the input values. A specific example that is often employed is the U-net, see Ronneberger, Olaf, Philipp Fischer, and Thomas Brox. "U-net: Convolutional networks for biomedical image segmentation." International Conference on Medical image computing and computer-assisted intervention. Springer, Cham, 2015. The U-net employs skip-connections between hidden layers and down-sampling and up-sampling of feature maps.

As a general rule, various options are available of implementing MRI reconstruction and, more specifically, MRI reconstruction using the NN. Some of these options are summarized in TAB. 1 below.

TABLE 1

Various options for using one or more reconstruction NNs for reconstructing MRI images from undersampled k-space data. These options can be combined with each other.

| | Brief description | Example details |
|---|---|---|
| I | Single feed-forward aliasing removal | In one example, it would be possible to use the NN to remove aliasing artefacts from a spatial-domain representation of the raw MRI data. Here, a single forward-pass of the NN may be used to remove the aliasing artefacts. The spatial-domain representation of the raw MRI data can be obtained through a Fourier transform of the raw MRI data. See, e.g., Xuan, Kai, et al. "Learning MRI k-Space Subsampling Pattern Using Progressive Weight Pruning." *International Conference on Medical Image Computing and Computer-Assisted Intervention.* Springer, Cham, 2020. |
| II | Fourier transform | In a further example, it would be possible to implement the Fourier transform of the raw MRI data using a NN. A Fourier transformation is a linear transform, and as such may be expressed by a special form of a fully connected layer of the NN. The weights are the initialized such that the fully connected layer performs a Fourier transformation of the input. By making the weights trainable, the Fourier transformation can then be adapted to the task at hand. A general example of such reconstruction is disclosed in: Zhu, Bo, et al. "Image reconstruction by domain-transform manifold learning." Nature 555.7697 (2018): 487-492. |
| III | Iterative optimization for aliasing removal | In yet a further example, an iterative optimization can include (i) a regularization operator - that is implemented by a trained NN such as a Convolutional NN (CNN) - for filtering of the input MRI dataset using convolutions and non-linear activations; and (ii) a data-consistency operator (sometimes referred to as forward-sampling operator or data-fidelity operator) for computation of an MRI forward model to assure agreement of the reconstructed MRI image with the MRI raw data. This approach of using an iterative optimization together with a deep-NN having layers associated with each iteration goes by the name of a variational NN (VNN). The complete network is also called an unrolled image reconstruction network, or simply unrolled network. Multiple iterations of (i) and (ii) iteratively refine the reconstructed MRI image, wherein an appropriate optimization technique, for example a gradient descent optimization technique or Landweber iterations, or prima-dual method, or alternating direction method of multipliers as known in the art, may be used to optimize parameters from iteration to iteration, i.e., to minimize a goal function including the regularization operator and the data-consistency operator. Such optimization technique may define parts of the data-consistency operation. The data-consistency operation can be based on the squared $\ell_2$-norm of the difference between measured data and synthesized data using a signal model. A gradient can be considered, in accordance with the optimization technique. In particular for decorrelated data with Gaussian noise this can be a good choice. |

TABLE 1-continued

Various options for using one or more reconstruction NNs
for reconstructing MRI images from undersampled k-space
data. These options can be combined with each other.

| Brief description | Example details |
|---|---|
| | The signal model can be SENSE-type and, in particular, may rely on predefined CSMs. The CSMs can be calculated separately. Examples of such techniques are disclosed in See Hammernik, Kerstin, et al. "Learning a variational network for reconstruction of accelerated MRI data." Magnetic resonance in medicine 79.6 (2018): 3055-3071, as well as Knoll, Florian, et al. "Deep learning methods for parallel magnetic resonance image reconstruction." arXiv preprint arXiv: 1904.01112 (2019). |

As will be appreciated, various options are available for leveraging MRI reconstruction using an NN. By using the NN in the context of the MRI reconstruction, an increased image quality of the respective reconstructed MRI dataset may be provided. A reduced noise amplification and reduced image artifacts can be obtained, in comparison with the conventional MRI reconstruction techniques. The natural image appearance may be better preserved using NN, e.g., without causing significant blurring in comparison to techniques with hand-crafted regularization operators. Conventional compressed sensing techniques may be slow and may result in less natural looking images. Using the NN, faster image reconstruction may be achieved using a predefined number of iterations of the NN. The reconstruction time is usually several orders of magnitude faster than in other iterative methods.

According to various examples, it is possible to increase the accuracy and quality of the MRI reconstruction using NNs.

Hereinafter, various techniques will be described that facilitate task-specific MRI reconstruction. Typically, the MRI imaging is applied in the context of a specific task, e.g., a certain diagnostic purpose. For instance, MRI imaging may be applied to detect a stroke region in the brain. MRI imaging may be applied to detect a teninopathy. MRI imaging may be applied to detect tumors or torn ligaments. Spinal cord defects can be detected. Depending on the specific task, different regions or body parts are imaged. Depending on the specific task, different objects are to be detected.

Various examples are based on the finding that task-specific MRI reconstruction can be facilitated by considering, at the training of the reconstruction NN-cf. TAB. 1-, a task-specific loss value. According to various examples, a task-specific loss value is considered when adjusting weights of the reconstruction NN.

In particular, it is possible to determine a contribution to the loss value that depends on whether or not a certain object—typically defined in a task-specific manner—is present or absent in the prediction of the MRI image obtained from the reconstruction of the raw MRI data. According to various examples, it is possible that the loss value is determined based on a difference between a ground truth of the presence or absence of an object and a prediction of the presence or absence of the object as obtained from an object-detection algorithm.

Thereby, it is possible to increase the accuracy and quality of the MRI reconstruction using NNs.

FIG. 1 depicts aspects with respect to an MRI device 100. The MRI device 100 includes a magnet 110, which defines a bore 111. The magnet 110 may provide a DC magnetic field of, e.g., one to eight Tesla along its longitudinal axis. The DC magnetic field may align the magnetization of the patient 101 along the longitudinal axis. The patient 101 may be moved into the bore via a movable table 102.

The MRI device 100 also includes a gradient system 140 for creating spatially-varying magnetic gradient fields (gradients) used for spatially encoding MRI data. Typically, the gradient system 140 includes at least three gradient coils 141 that are arranged orthogonal to each other and may be controlled individually. By applying gradient pulses to the gradient coils 141, it is possible to apply gradients along certain directions. The gradients may be used for slice selection (slice-selection gradients), frequency encoding (readout gradients), and phase encoding along one or more phase-encoding directions (phase-encoding gradients). Hereinafter, the slice-selection direction will be defined as being aligned along the Z-axis; the readout direction will be defined as being aligned with the X-axis; and a first phase-encoding direction as being aligned with the Y-axis. A second phase-encoding direction may be aligned with the Z-axis. The directions along which the various gradients are applied are not necessarily in parallel with the axes defined by the coils 141. Rather, it is possible that these directions are defined by a certain k-space trajectory, which, in turn, may be defined by certain requirements of the respective MRI sequence and/or based on anatomic properties of the patient 101.

As a general rule, the k-space trajectory may also be adjusted during a training of the MRI reconstructions, to match the k-space trajectory with the reconstruction data processing. Such techniques will be explained in connection with FIG. 3: box 3030.

For preparation and/or excitation of the magnetization polarized/aligned with the DC magnetic field, RF pulses may be applied. For this, an RF coil assembly 121 is provided which is capable of applying an RF pulse such as an inversion pulse or an excitation pulse or a refocusing pulse. While the inversion pulse generally inverts the direction of the longitudinal magnetization, excitation pulses may create transversal magnetization.

For creating such RF pulses, an RF transmitter 131 is connected via a RF switch 130 with the coil assembly 121. Via a RF receiver 132, it is possible to detect signals of the magnetization relaxing back into the relaxation position aligned with the DC magnetic field. In particular, it is possible to detect echoes; echoes may be formed by applying one or more RF pulses (spin echo) and/or by applying one or more gradients (gradient echo). The magnetization may inductively coupled with the coil assembly 121 for this purpose. Thereby, raw MRI data in k-space is acquired; according to various examples, the associated MRI measurement datasets including the MRI data may be post-processed in order to obtain images. Such post-processing may include a Fourier Transform from k-space to image space. Such post-processing may also include MRI reconstruction configured to avoid motion artifacts.

Generally, it would be possible to use separate coil assemblies for applying RF pulses on the one hand side and for acquiring MRI data on the other hand side (not shown in FIG. 1). For example, for applying RF pulses a comparably large body coil 121 may be used; while for acquiring MRI data a surface coil assembly including an array of comparably small coils could be used. For example, the surface coil assembly could include 32 individual RF coils arranged as receiver coil array 139 and thereby facilitate spatially-offset coil sensitivities. Respective CSMs can be defined.

The MRI device 100 further includes a human machine interface 150, e.g., a screen, a keyboard, a mouse, etc. Via the human machine interface 150, a user input may be detected and output to the user may be implemented. For example, via the human machine interface 150, it is possible to set certain configuration parameters for the MRI sequences to be applied.

The MRI device 100 further includes a processing unit (simply processor) 161. The processor 161 may include a GPU and/or a CPU. The processor 161 may implement various control functionality with respect to the operation of the MRI device 100, e.g., based on program code loaded from a memory 162. For example, the processor 161 could implement a sequence control for time-synchronized operation of the gradient system 140, the RF transmitter 131, and the RF receiver 132. The processor 161 may also be configured to implement an MRI reconstruction, i.e., implement post-processing for MRI reconstruction of MRI images based on MRI measurement datasets.

It is not required in all scenarios that processor 161 implements post-processing for reconstruction of the MRI images. In other examples, it would be possible that respective functionalities implemented by a separate device, such as the one as illustrated in FIG. 2.

Figure 2:
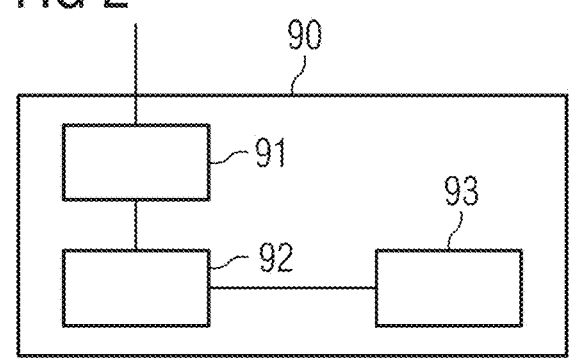
FIG. 2 schematically illustrates a device according to various examples.

FIG. 2 schematically illustrates a device 90 according to various examples. The device 90 includes a processing unit/processor 91 and a memory 92. The processor 91 can obtain MRI Raw data via an interface 93, e.g., from a hospital database, a computer-readable storage medium, or directly from an MRI device 100 as discussed in connection with FIG. 1. Upon loading program code from the memory 92, the processor 91 can post-process the MRI raw data, to reconstruct an MRI image. Specifically, the processor 91 can employ a reconstruction NN-cf. NN—to determine a prediction of the MRI image. Also, the processor 91 can train the reconstruction NN.

Details with respect to such training of the reconstruction NN are illustrated in connection with FIG. 3.

Figure 3:
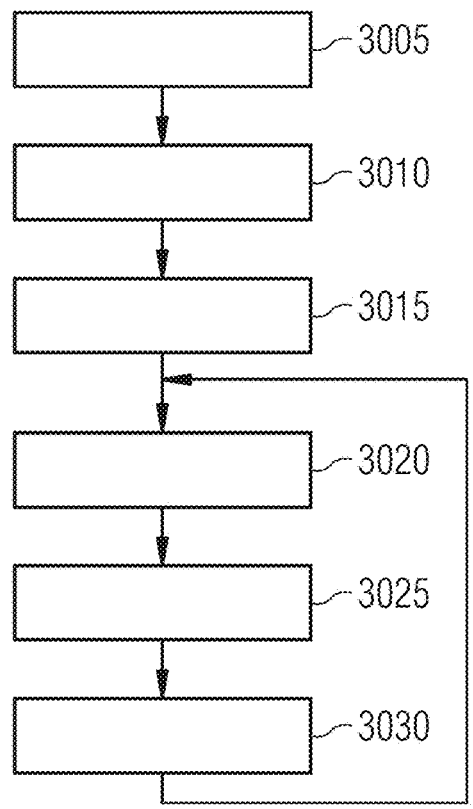
FIG. 3 is a flowchart of a method according to various examples.

FIG. 3 is a flowchart of a method according to various examples. A NN is trained to accurately reconstruct MRI images based on MRI raw data that has been acquired using K-space trajectories that are undersampling the K-space. The NN can be employed in the context according to one of the examples of TAB. 1. The method of FIG. 1 could be executed by on on-device processor such as the processor 161 of the MRI device 100 in the example of FIG. 1. It would also be possible that the method of FIG. 1 is executed by a separate device such as the device 90. For instance, the method of FIG. 3 could be executed by the processor 92 of the device 90 upon loading program code from the memory 93.

The method commences at box 3005. At box 3005, training MRI raw data is obtained. The training MRI raw data may be obtained from an MRI device such as the MRI device 100. The training MRI data may be obtained from a database, e.g., a picture archiving system of a hospital or a central database on the Internet.

Obtaining the data may generally include loading the respective data via an interface or from a memory, or even controlling another device to acquire the data.

The method proceeds at box 3010; here, a ground truth of a training MRI image that is associated with the training MRI data is obtained. The training MRI image can thus resemble the artifact-free image-domain representation of the MRI raw data.

As a general rule, various options are available for obtaining the training MRI image. For instance, it would be possible to fully sample the K-space, i.e., using a K-space trajectory that is not undersampling the K-space. Based on such full sampling of the K-space, it would be possible to determine the training MRI image. Then, it would be possible to discard certain K-space samples such that the undersampling of the K-space according to the K-space trajectory is obtained for the respective training MRI data. In such an approach it is also possible to synthesize different raw MRI data for different K-space trajectories. This can be helpful for scenarios in which the K-space trajectory itself is adjusted during the training, as will be later-on explained in connection with box 3030.

Next, a ground truth of object presence or object absence is obtained at box 3015. For instance, a respective label indicated for of whether a certain anatomical structure or condition is visible in the training MRI image may be obtained. It would be possible to use supervised learning. I.e., respective labels may be annotated by an expert, e.g., a clinician.

The object can be defined in a task-specific manner. I.e., depending on the specific radiology task, a different object may be defined.

As a general rule, object presence or object absence may be determined for multiple different object classes. I.e., for certain image body region, there may be multiple candidate objects that could be potentially visible in the training MRI image. For each of these candidate objects, would be possible to determine object presence or object absence as ground truth.

Example objects include: tendon rupture; vertebral fracture; stroke region; thrombosis; etc.

At box 3015, it would also be possible to obtain a ground truth for additional information pertaining to the object. For instance, it would be possible to obtain a ground truth of an object location of the object in the training MRI image.

As a general rule, various options are available for specifying the object location. For instance, a center of the object could be specified. It would be possible to use bounding boxes, e.g., rectangular or square structures or even 3D structures of minimum size that enclose the entire object.

At box 3020, a prediction of the training MRI image is determined using the NN. Here, the NN in its current training states, i.e., using the currently set weights, is used.

Then, also at box 3020, a prediction of the presence or absence of the object in the training MRI image is determined, using an object-detection algorithm that operates based on the prediction of the training MRI image also determined at box 3020.

As a general rule, various options are available for implementing the object-detection algorithm. Classical feature-based detection algorithms could be used. It would also be possible to use an object-detection NN. Here, various kinds and types of object-detection NNs can be used as generally known to the skilled person. An example would be described in: Lin, Tsung-Yi, et al. "Focal loss for dense object detection." Proceedings of the IEEE international conference on computer vision. 2017. The object-detection NN is used in its current training state, i.e., using the currently set weights.

Optionally, where applicable, it would also be possible to determine a prediction of the location of the object in the training MRI image based on the training MRI image and using the object-detection algorithm.

Then, the method commences at box 3025. Here, a loss value is determined. The loss value is sometimes also referred to as cost value.

To do so, the predictions of box 3020 are compared with the respective ground truth. This would include, e.g., determining the loss value based on a first difference between the ground truth of the training MRI image and the prediction of the training MRI image, and further based on a second difference between the ground truth of the presence or absence of the object in the prediction of the presence or absence of the object.

For instance, the first difference could be a pixel wise difference squared and then a sum across all pixels could be formed.

Optionally, a third difference can be taken into account when determining the loss value, the third difference being between the ground truth of the object location of the object and the prediction of the object location of the object.

As will be appreciated, various task-specific contributions to the loss value have been disclosed, i.e., presence or absence of the object and object location. As a general rule, further or different task-specific contributions to the loss value would be conceivable, e.g., a confidence level of the object-detection algorithm.

More generally, the loss value could be expressed as: L(x, θ)=Detection(R(x, theta))+Reconstruction(R(x, theta))+Undersampling(x, theta).

Here x refers to the raw MRI data in k-space, θ refers to the learnable parameters (i.e., weights of the respective networks as well as parameters for sampling pattern determination), and R(x, theta) is the reconstructed MRI image.

"Detection" is based on the difference between the prediction of the absence or presence of the object and optionally the prediction of the object location, as well as the respective ground truth. More generally, this contribution can be task-specific.

"Reconstruction" is the image-based contribution, i.e., the difference between the prediction of the MRI image and the ground truth of the MRI image. For instance, a comparison between corresponding pixels could be implemented.

"Undersampling" is a contribution to the loss value that can be optionally considered. It is associated with the k-space trajectory. For instance, this contribution could penalize longer acquisition times. I.e., it would be possible that the loss value is further based on an acquisition time associated with the K-space trajectory. Thereby, during the training, specifically an iterative training process, the amount of K-space samples can be reduced. The time required to acquire the image can be reduced.

The undersampling contribution is generally optional. In some examples, it would be possible that the undersampling contribution is only considered in connection with adjusting the trajectory used to sample the K-space, while the detection loss and the reconstruction loss are used to adjust the parameters of the NN. in such a scenario, it is not required to combine the undersampling contribution with the detection and reconstruction contribution into a single loss value. Rather, two separate loss values can be used, one adjusting the K-space trajectory, and one for adjusting the weights of the NN.

It is then possible to adjust weights at least of the NN, at box 3030. This is based on the loss value in using a training process. Various training processes generally known to the skilled person in the art can be used, e.g., back-propagation: Here, the gradient of the loss function can be calculated with respect to the weights of the network. This enables an iterative optimization technique—see FIG. 3, where boxes 3020, 3025, and 3030 can be iteratively executed—employing a gradient descent optimization. This can be used where a set of training MRI raw data and respective ground truths is obtained.

For a scenario in which a NN is used to implement the object-detection algorithm, it would be possible to not only adjust the weights of the NN, but also of the object-detection NN, based on the loss value, at box 3030. Specifically, it would be possible to employ end-to-end the training of the NN and the object-detection NN. Here, a gradient of the loss function can be determined for the object detection NN can be further propagated into the reconstruction NN. More generally, the weights of the reconstruction NN and the object-detection NN are coherently adjusted, i.e., in a combined fashion and coupled to each other. This increases the accuracy of the training.

Above, examples have been illustrated in which parameters of the reconstruction NN and optionally the object detection NN are adjusted at box 3030. It is optionally possible that at box 3030, hyperparameters of the reconstruction NN and/or even of the MRI measurement are adjusted.

For instance, it would be possible to implement network slimming. Here, it would be possible that some weights of the reconstruction NN are fixedly set to 0. Specifically, it would be possible to force such weights of the reconstruction NN to zero that fall below a certain predefined threshold. Respective techniques are generally described in Xuan, Kai, et al. "Learning MRI k-Space Subsampling Pattern Using Progressive Weight Pruning." International Conference on Medical Image Computing and Computer-Assisted Intervention. Springer, Cham, 2020. For illustration, such techniques may be specifically employed where the reconstruction NN is used to implement a Fourier transform, cf. TAB. 1: example II. By network slimming, the complexity of the calculation can be reduced, reducing computational resources.

In a further example, it would be possible to slim-alternatively or additionally to slimming the reconstruction NN—the K-space trajectory. Specifically, it could be checked which weights of the input layer of the reconstruction NN have values that are smaller than a certain predefined threshold. Then, corresponding K-space positions may be removed from the K-space trajectory. Thereby, the acquisition time required to sample the K-space can be reduced.

As a general rule, alternatively or additionally, and specifically beyond slimming of the K-space trajectory, it would be generally possible that the training process adjusts the K-space trajectory during the training process and based on the loss value.

I.e., it would be possible to re-arrange sampling points in K-space. The sampling point density could be adjusted. The orientation and/or shape of the K-space trajectory could be adjusted. For instance, different shapes of K-space trajectories may be chosen, e.g., radial, spiral, cartesian, random. Data points may be added or removed.

There are various options available for implementing said adjusting of the K-space trajectory using the training process. For instance, where an iterative optimization is used to implement the training process, random adjustments can be made from iteration to iteration in the respective impact on the loss value can be observed. It would also be possible to make directed adjustments, e.g., based on the weights of the input layer of the reconstruction NN.

By such adjusting of the K-space trajectory, it can be ensured that such spatial frequencies are sampled that have a high impact on the accurate reconstruction of the MRI image. At the same time, unnecessary or low-impact spatial frequencies may not be sampled, or respective regions may be sampled less densely.

As a general rule, when adjusting the K-space trajectory, it would be possible to observe one or more predefined constraints. Such constraints can be based on hardware limitations, e.g., with respect to switching speeds, or strength of DC magnetic field gradients. Thereby, a physically feasible K-space trajectory can be obtained.

Once the training has been completed, the reconstruction NN can be used to make predictions during inference, i.e., where no ground truth is available.

Figure 4:
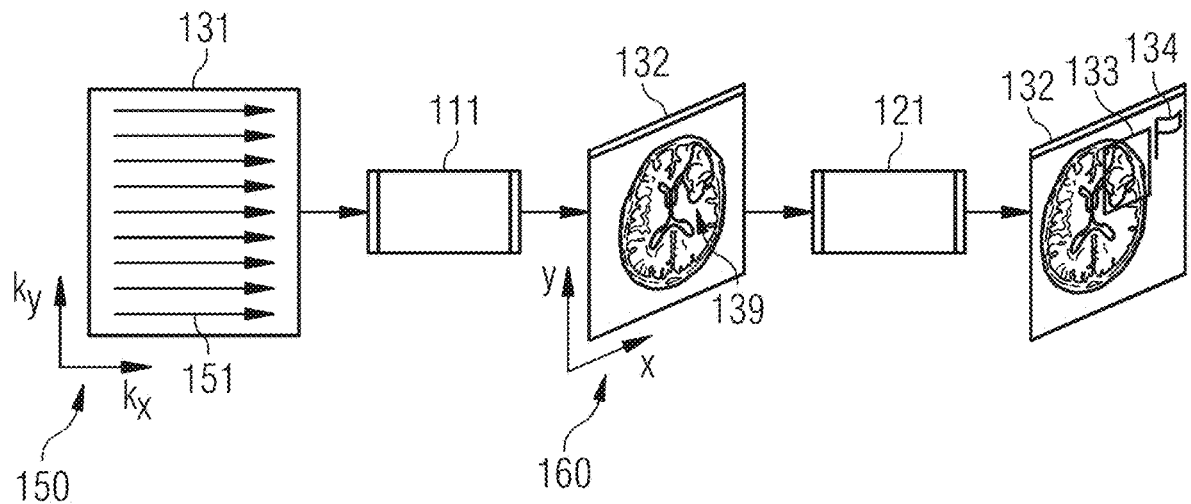
FIG. 4 illustrates data processing according to various examples.

FIG. 4 illustrates the data processing for MRI reconstruction. A reconstruction NN 111 is employed that can be trained using the method of FIG. 3.

The MRI raw data, e.g., training MRI raw data 131, corresponds to data samples that have been acquired using a K-space trajectory 151 undersampling the K-space 150.

While in FIG. 4 a Cartesian K-space trajectory as illustrated, as a general rule, various other types and forms of K-space trajectories 151 may be used, e.g., radial sampling, circular sampling, or random sampling. The K-space trajectory 151 can also be adjusted using the training process.

The (training) MRI raw data 131 is then passed to a reconstruction NN 111. For instance, the reconstruction NN 111—e.g., a CNN—can include a first sub-reconstruction NN implementing a Fourier transform of the training MRI raw data 131 to the image domain, and a second sub-reconstruction NN implementing removal of aliasing artefacts.

Thereby, a reconstruction of a (training) MRI image 132 in image domain 160 is obtained. The (training) MRI image 132 depicts an object 139, here a stroke region.

Based on the prediction of the (training) MRI image 131, the object-detection algorithm 121 can determine the prediction of presence or absence 134 and optionally of location 133 of the object 139. The location 133 is illustrated with the bounding box and the presence or absence 134 with the respective label.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "on," "connected," "engaged," "interfaced," and "coupled." Unless explicitly described as being "direct," when a relationship between first and second elements is described in the disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" on, connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed above. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. The present invention may, however, be embodied in many alternate forms and should not be construed as limited to only the embodiments set forth herein.

In addition, or alternative, to that discussed above, units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one example embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although the present invention has been shown and described with respect to certain example embodiments, equivalents and modifications will occur to others skilled in the art upon the reading and understanding of the specification. The present invention includes all such equivalents and modifications and is limited only by the scope of the appended claims.

What is claimed is:

1. A computer-implemented method of training a reconstruction neural network algorithm used to reconstruct a Magnetic Resonance Imaging (MRI) image based on MRI raw data, the computer-implemented method comprising:
    obtaining training MRI raw data acquired using a k-space trajectory that is undersampling the k-space;
    obtaining a ground truth of a training MRI image associated with the training MRI raw data;
    obtaining a ground truth of a presence or absence of an object in the training MRI image;
    obtaining a ground truth of a location of the object in the training MRI image;
    determining a prediction of the training MRI image based on the training MRI raw data and using the reconstruction neural network algorithm;
    determining a prediction of the presence or absence of the object in the training MRI image based on the prediction of the training MRI image and using an object-detection algorithm;
    determining a prediction of the location of the object in the training MRI image based on the training MRI image and using the object-detection algorithm;
    determining a loss value based on (i) a first difference between the ground truth of the training MRI image and the prediction of the training MRI image, and (ii) a second difference between the ground truth of the presence or absence of the object and the prediction of the presence or absence of the object, and (iii) a third difference between the ground truth of the location of the object and the prediction of the location of the object; and
    adjusting weights of the reconstruction neural network algorithm based on the loss value and using a training process.

2. The computer-implemented method of claim 1, wherein
    the object-detection algorithm is an object-detection neural network algorithm, and
    the method further includes adjusting weights of the object-detection neural network algorithm based on the loss value and using the training process.

3. The computer-implemented method of claim 2, wherein the training process is an end-to-end training process coherently adjusting the weights of the reconstruction neural network algorithm and the weights of the object-detection neural network algorithm.

4. The computer-implemented method of claim 3, further comprising:
    slimming at least one of the reconstruction neural network algorithm or the k-space trajectory using the training process.

5. The computer-implemented method of claim 3, further comprising:
    adjusting the k-space trajectory based on the loss value and using the training process.

6. The computer-implemented method of claim 2, further comprising:
    slimming at least one of the reconstruction neural network algorithm or the k-space trajectory using the training process.

7. The computer-implemented method of claim 2, further comprising:
    adjusting the k-space trajectory based on the loss value and using the training process.

8. The computer-implemented method of claim 1, further comprising:

slimming at least one of the reconstruction neural network algorithm or the k-space trajectory using the training process.

9. The computer-implemented method of claim 8, further comprising:
adjusting the k-space trajectory based on the loss value and using the training process.

10. The computer-implemented method of claim 1, further comprising:
adjusting the k-space trajectory based on the loss value and using the training process.

11. A computer-implemented method, comprising:
obtaining MRI raw data acquired using a k-space trajectory that is undersampling the k-space,
determining a prediction of an MRI image using a reconstruction neural network algorithm, and
determining, using an object-detection algorithm, a prediction of a presence or absence of an object in the MRI image,
wherein the reconstruction neural network algorithm has been trained using the computer-implemented method of claim 1.

12. A device comprising one or more processors configured to perform the computer-implemented method of claim 1.

13. A device comprising:
one or more processors configured to
obtain MRI raw data acquired using a k-space trajectory that is undersampling the k-space,
determine a prediction of an MRI image using a reconstruction neural network algorithm, and
determine a prediction of a presence or absence of an object in the MRI image using an object-detection algorithm,
wherein the reconstruction neural network algorithm has been trained using the computer-implemented method of claim 1.

14. A non-transitory computer program product comprising instructions which, when executed by a computer, cause the computer to carry out the method of claim 1.

15. A non-transitory computer-readable storage medium comprising instructions which, when executed by a computer, cause the computer to carry out the method of claim 1.

16. The computer-implemented method of claim 1, wherein the loss value is further based on an acquisition time associated with the k-space trajectory.

17. A computer-implemented method of training a reconstruction neural network algorithm used to reconstruct a Magnetic Resonance Imaging (MRI) image based on MRI raw data, the computer-implemented method comprising:
obtaining training MRI raw data acquired using a k-space trajectory that is undersampling the k-space;
obtaining a ground truth of a training MRI image associated with the training MRI raw data;
obtaining a ground truth of a presence or absence of an object in the training MRI image;
determining a prediction of the training MRI image based on the training MRI raw data and using the reconstruction neural network algorithm;
determining a prediction of the presence or absence of the object in the training MRI image based on the prediction of the training MRI image and using an object-detection algorithm;
determining a loss value based on (i) a first difference between the ground truth of the training MRI image and the prediction of the training MRI image, and (ii) a second difference between the ground truth of the presence or absence of the object and the prediction of the presence or absence of the object; and
adjusting weights of the reconstruction neural network algorithm based on the loss value and using a training process; wherein
the loss value is further based on an acquisition time associated with the k-space trajectory.

18. A device for training a reconstruction neural network algorithm used to reconstruct a Magnetic Resonance Imaging (MRI) image based on MRI raw data, the device comprising:
one or more processors configured to
obtain training MRI raw data acquired using a k-space trajectory that is undersampling the k-space,
obtain a ground truth of a training MRI image associated with the training MRI raw data,
obtain a ground truth of a presence or absence of an object in the training MRI image,
obtain a ground truth of a location of the object in the training MRI image,
determine a prediction of the training MRI image based on the training MRI raw data and using the reconstruction neural network algorithm,
determine a prediction of the presence or absence of the object in the training MRI image based on the prediction of the training MRI image and using an object-detection algorithm,
determine a prediction of the location of the object in the training MRI image based on the training MRI image and using the object-detection algorithm,
determine a loss value based on (i) a first difference between the ground truth of the training MRI image and the prediction of the training MRI image, and (ii) a second difference between the ground truth of the presence or absence of the object and the prediction of the presence or absence of the object, and (iii) a third difference between the ground truth of the location of the object and the prediction of the location of the object, and
adjust weights of the reconstruction neural network algorithm based on the loss value and using a training process.

* * * * *